United States Patent [19]

Bush et al.

[11] 4,338,354

[45] Jul. 6, 1982

[54] COATING POWDERED MATERIAL

[75] Inventors: Eric L. Bush, Matching Green, Nr. Harlow; Ernest J. Workman, Bishop's Stortford, both of England

[73] Assignee: International Standard Electric Corporation, New York, N.Y.

[21] Appl. No.: 143,975

[22] Filed: Apr. 28, 1980

[51] Int. Cl.$^3$ .............................................. B05D 5/12
[52] U.S. Cl. ...................................... 427/80; 427/79; 427/213; 427/214; 427/217; 427/250; 427/252
[58] Field of Search ................ 428/404; 427/217, 253, 427/213, 79, 80, 250, 250.2

[56] References Cited

U.S. PATENT DOCUMENTS

| | | | |
|---|---|---|---|
| 3,248,612 | 4/1966 | Rogers | 427/217 |
| 3,252,823 | 5/1966 | Jacobson | 427/213 |
| 4,196,233 | 4/1980 | Bitger | 427/253 |

FOREIGN PATENT DOCUMENTS

| | | | |
|---|---|---|---|
| 2306402 | 9/1973 | Fed. Rep. of Germany | 427/213 |
| 2454138 | 5/1975 | Fed. Rep. of Germany | 427/213 |
| 139602 | 1/1980 | German Democratic Rep. | 427/253 |

*Primary Examiner*—Sam Silverberg
*Attorney, Agent, or Firm*—John T. O'Halloran; David M. Quinlan

[57] ABSTRACT

A process for coating a particulate insulating material, e.g. alumina, with a uniform layer of a valve metal. The particles are exposed to a gaseous nitrogen compound, or to nitrogen gas together with hydrogen and a volatile halide of the valve metal. It is thought that nitrogen provides nucleation of the surface for subsequent metal deposition. The coated powder may be used in the fabrication of electrolytic capacitor anodes.

6 Claims, No Drawings

COATING POWDERED MATERIAL

This invention relates to processes for coating particulate materials, and in particular to a process for the chemical vapour deposition of a metal surface layer on a powder.

In the manufacture of metal coated powders, such as are employed in the construction of electrolytic capacitor anodes, it is necessary to provide a uniform metal coating on a relatively finely divided insulating material. Typically the finely divided material has a particle size of the order of 13 microns, but coated particles of the order of 3 microns would be preferable. Coating of such finely divided material involves difficulties that were previously thought to be insuperable.

In order to manufacture a capacitor anode from a metal coated powder, the material is compressed so that the metal flows away from the points of contact between the coated particles and the whole mass cold welds into a solid porous body. It is highly advantageous to limit the thickness of the metal coating so that the compaction process becomes self limiting, there being insufficient metal to fill the voids between the particles. The technique is more fully described in our published specification No. 1,506,667 (E. L. Bush - D. W. J. Hazelden 18-5). To achieve such a compaction process with relatively fine particles it is essential that the coating metal be of a corresponding "thinness".

It has been demonstrated that, for example, alumina particles with an average diameter of 13 microns can be provided, albeit with difficulty, with a tantalum coating via a chemical vapour deposition process. In such a process it is possible to achieve a tantalum coating on 90% of the particles when the average tantalum content is greater than 40% by weight. Detailed investigation of the material during the deposition process has shown that the metal growth develops from island nuclei on the surface of the substrate particles. Some of the particles, even at an advanced stage of the deposition process, remain completely devoid of metal presumably due to the absence of a nucleation centre from which metal growth can occur. Thus to ensure an adequate metal coating it is therefore necessary to deposit excess metal. This problem is of course exacerbated as the particle size becomes smaller and the number of particles lacking a nucleation centre increases.

It has previously been considered that, for the satisfactory manufacture of tantalum capacitor anodes from coated powders of 200 to 230 mesh, a minimum tantalum coating thickness of 2.5 microns is required. Theoretical calculations however, indicate that, to achieve anodized layers of tantalum pentoxide with a breakdown strength of 50 volts a minimum metal coating thickness of only 0.05 microns will suffice. This apparent discrepancy is thought to arise from the fact that previous workers in this field have achieved island growth only. Thus, it is possible to obtain a metal 'coated' powder which, when pressed and sintered, cannot be anodized as there is no interconnection of the individual metal islands.

In the manufacture of tantalum electroylic capacitors it is advantageous to manufacture the capacitor anodes from tantalum coated powder rather than from tantalum metal powder. In order for tantalum coated powders to be economic however, it is necessary to utilize substrate powders of a particle size comparable to that of commerically available tantalum powders. Such tantalum metal powders have particle sizes within the range 1 to 5 microns and typically provide specific capacitance values of 30,000 to 60,000 microcoulombs/cc and 4,000 to 12,000 microcoulombs/g. To achieve similar proportions with tantalum coated powders it is essential to employ a powder substrate with a particle diameter of 3 microns or less. The tantalum coating should also be limited to an average thickness of about 0.3 micron which is equivalent to 75 weight % of the tantalum metal in the coated product. It would in fact be preferable to limit the tantalum content to 50 weight %, which represents a coating thickness of only 0.1 micron.

According to one aspect of the invention there is provided a process for depositing by chemical vapour deposition a substantially uniform valve metal coating on a particulate insulating substrate, the process including introducing a nucleating agent during the deposition process, the nucleating agent being such that it provides for deposition of an initial surface coating of the valve metal via an irreversible reaction.

According to another aspect of the invention there is provided a process for depositing by chemical vapour deposition a substantially uniform layer of tantalum or niobium on a particulate alumina substrate, the process including exposing the alumina particles, at least some of which are wholly or partially coated with tantalum or niobium, to nitrogen gas or to a gaseous nitrogen compound together with a hydrogen halide, wherein the hydrogen halide reacts with the tantalum or niobium coating to provide a gaseous species which reacts with nitrogen or the nitrogen compound thereby depositing a uniform surface layer on said particles via an irreversible reaction.

According to a further aspect of the invention there is provided a method of making a composite powder, including exposing a mixture of a valve metal powder and a relatively hard particulate insulating material to a mixture of a nitrogen containing vapour and a hydrogen halide at a temperature of 700° C. to 1400° C. for a sufficient period of time to transport the valve metal onto the insulating material.

In order to provide a tantalum, or other valve metal, coating of not greater than 0.3 microns thickness on a 3 micron diameter powder substrate it is essential to employ a deposition process which provides uniform growth rather than "fill-in" of island growth. We have found that uniform growth of a metal film on an insulating ceramic surface can proceed only after a complete nucleation of the surface has occurred. This necessitates a high degree of supersaturation of the depositing metal species.

In many metal deposition processes the chemical reaction is thermodynamically reversible, the forward and reverse reactions being stimulated by control of temperature and the partial pressures of the various gaseous species. Thus, for example, the deposition of such valve metals as tantalum and niobium may proceed via the following typical reactions:

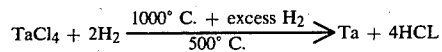

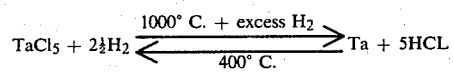

-continued

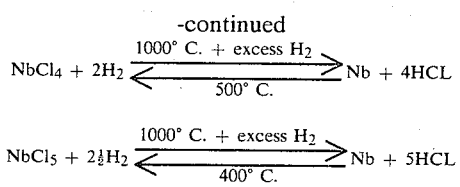

Even at 1000° C. and a 20-fold excess of hydrogen, the conversion of tantalum chloride to tantalum metal is only 96% efficient. The result is that, in the absence of extensive nucleation, once tantalum growth has been initiated on parts of the surface there is a tendency for these regions to grow at the expense of the remainder of the surface and that the remainder of the surface remains uncovered.

We have found that it is possible to modify the chemical transport reaction to provide an irreversible deposition step to give a metal-compatible deposit such that metal deposition then proceeds uniformly over the nucleated surface. Such a modified reaction process is postulated as follows:

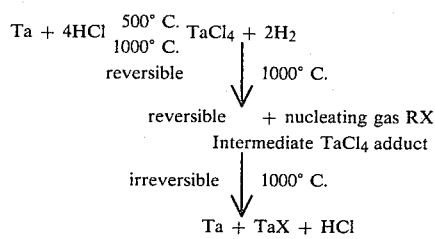

We have made the unexpected discovery that this reaction sequence may in fact be achieved with the aid of certain nitrogen containing reactive gases, e.g. ammonia. When ammonia is employed as the nucleating gas, then the tantalum deposits over the complete surface of all the particles within the reaction region. The tantalum film thus deposited may contain up to 10 weight % nitrogen, possibly in the form of one or more nitrides. Further deposition of tantalum by the normal thermodynamically reversible process results in the build up of substantially uniform layers of tantalum on all particles. The electrical and physical properties of the final coated particulate product are substantially unaffected by the thin interfacial underlayer of nitrided tantalum.

All attempts to achieve uniform surface coverage of fine alumina powder with tantalum without initial treatment with a nucleating gas have proved unsuccessful unless uneconomically large quantities of tantalum are deposited. Ammonia is relatively cheap and readily obtainable and is thus an attractive choice as the nucleating gas. However, other nitrogen containing gas may of course be employed, and we have achieved successful nucleation with, e.g., ammonium chloride, hydrazine-hydrochloride, hydroxylamine hydrochloride or their other halides and, under certain conditions, even nitrogen gas. We have also found that nucleation can be achieved not only with nitrogen compounds but also other materials which react in an irreversible way to form a surface layer compatible with a subsequent depositing species. Thus, volatile borides, sulphides, phosphides and silicides may all be employed as nucleating agents. Nitrogen compounds are to be preferred however as they are relatively cheap and, in general, easier to handle.

The technique is applicable to various types of processes for the production of uniformly metal coated particles.

In the process uncoated particles are mixed with coated or partially coated particles and are then treated with a mixture of a hydrogen halide and a nucleating gas so as to transport metal from the coated particles to the uncoated particles and provide a substantially uniform surface coverage of all the particles. In an alternative process uniformly coated particles are treated with a hydrogen halide and a nucleating gas to 'spread' the metal into a uniform coating.

In a modification of these two processes, uncoated insulating particles are mixed with metal particles e.g. in a fluidized bed. The mix is treated with a hydrogen halide together with a nucleating gas so as to transport the metal to the surface of each insulating particle.

In a further process, uncoated particles are treated with a mixture of a metal halide vapour and a nucleating gas to cause decomposition of the halide and substantially uniform deposition of the metal.

For use as a capacitor anode material the substrate powder should be between 1 and 30 microns in diameter. The process described herein has been found to produce uniform metal coatings and such powders met the required metal thickness of less than 1 micron.

In a typical deposition process, a mixture of finely divided alumina and tantalum powders or partly coated alumina powder is dispersed in a fluidised bed in a flow of hydrogen at a temperature of 900° C. to 1100° C. Nucleation of the alumina is then effected by exposing the powder to an atmosphere of hydrogen containing e.g. 10 volume % ammonia and 10 volume % hydrogen chloride for a period of 5 minutes. During the nucleation period metallic tantalum reacts with the hydrogen chloride to form a volatile tantalum chloride whereby tantalum is transported to the alumina particles and is deposited on the alumina surface via an irreversible reaction to yield a nitrided tantalum surface. Further deposition of tantalum can then take place via the normal reversible reaction process. The deposited tantalum contains up to 10 weight % nitrogen.

The material thus formed may then be pressed into electrolytic capacitor anodes e.g. by the process described in our published specification No. 1,507,667 (E. L. Bush - D. W. J. Hazelden 18-5). In such a process the powder is pressed such that the relatively soft valve metal flows away from the points of contact of the relatively hard alumina particles, the whole mass cold welding into a porous body. The metal coating is of sufficient "thinness" that the metal cannot completely fill the voids between the particles.

The following example illustrates the invention:

EXAMPLE

A series of mixtures of alumina, tantalum and optionally silica powders were prepared and exposed to mixtures of hydrogen, hydrogen chloride and ammonia so as to coat the alumina particles with tantalum metal. The various powder treatments are summarized in the following table:

TABLE 1

| Ref | Gas Flow l/min. H₂ | HCl | NH₃/HCl ratio | Treatment time (mins) | Ta Dep. time (hrs.) | Bed System | Charge Wt. (grams) | Description |
|---|---|---|---|---|---|---|---|---|
| MP10 | 30 | 3 | — | — | 13 | Fluid (Dynamic) | 4000 | 3μ Al₂O₃ |
| MP17 | 40 | 3 | — | — | 16 | Fluid | 4000 | 3μ Al₂O₃/150μ sand 3/1 by wt |
| MP21 | 35 | 3 | — | — | 19½ | Fluid | 4000 | 3μ Al₂O₃/150μ sand 3/1 by wt |
| MP7 | 25 | 4 | — | — | 10 | Fluid | 5000 | 3μ Al₂O₃/120μ Al₂O₃ 3/1 by wt |
| MP2 | 60 | 6 | — | — | 10 | Fluid | 4000 | 13μ Al₂O₃ |
| NT36 | 1.2 | — | 0.4/0.2 | 1 × 5 | — | Static | 30 | MP7 - Coated 3μ Al₂O₃ |
| LR118 | 8 | 0.5 | 0.5/0.5 | 2 × 10 | 8½ | Fluid | 250 | 3μ Al₂O₃/120μ Al₂O₃ 4/1 by wt |
| LR119 | 8 | 0.4 | 0.4/0.2 | 3 × 10 | 12 | Fluid | 215 | 3μ Al₂O₃/120μ Al₂O₃ 3/1 by wt |
| MP25 | 35 | 4-5 | 3/2 | 4 × 10 | 10⅝ | Fluid | 4600 | 3μ Al₂O₃/120μ Al₂O₃ 7/1 |
| NT55 (Before Nucl NT54) | 1.5 | — | 0.6/0.3 | 5 × 10 | — | Static | 35 | 3μ Al₂O₃ Each Treatment after new addition tantalum |
| NT55 After Nucl | 1 | — | 0.4/0.2 | 1 × 5 | — | Static | 35 | |

Some of the coated particles were then employed to manufacture capacitor anodes. The capacitance yield was measured in each case and the results summarized in Table 2.

The results demonstrate the feasibility of the use of the process described herein for the manufacture of metal coated powders suitable for capacitor anode constructions.

TABLE 2

| Ref | Resistivity ohm cms | wt % Ta | Anodizing voltage | Capacitance yield μ coulombs (μC) μC/g | μC/cc | Comments |
|---|---|---|---|---|---|---|
| MP10 | 700K | 51.3 | — | — | — | 3μm alumina Ta deposition without nucleation process. |
| MP16 | 1.3M | 63.2 | — | — | — | |
| MP21 | 490 | 76.5 | — | — | — | Powder difficult to compact and would not make capacitors. |
| MP7 | 2.3 | 52.7 | — | 7000 | 38000 | |
| MP2 | 0.4 | 38 | — | 8300 | | 13μm alumina, Ta deposition without nucleation. |
| NT36 | | 52.7 | 12 | 14300 | 58000 | MP7 subjected to nucleation only, no further Ta deposition |
| LR118 | 0.1 | 64.1 | 24 | 14200 | 57700 | 3μm alumina, Ta deposition, subjected to nucleation process. |
| LR119 | 0.4 | 53.1 | 24 | 20400 | 71700 | |
| MP25 | 0.1 | 58 | 24 | 19600 | 80300 | |
| NT55 Before | >10M | 40 | — | — | — | Physical mixture of 40% by weight Ta, 60% Al₂O₃ subjected to nucleation process only. |
| NT55 After Nucl | 0.3 | 40 | 12 | 10000 | 30000 | |

We claim:

1. A process for depositing a substantially uniform layer of tantalum or niobium on a particulate insulating substrate, the process including: substantially completely nucleating said substrate by exposing at a predetermined temperature between 600° C. and 1400° C. the substrate to a gaseous mixture of tantalum or niobium halide and a nucleating agent selected from the group consisting of ammonia, an ammonium halide, a hydrazine-hydrohalide, a hydroxylamine-hydrohalide, nitrogen, a boron halide, a sulphur halide, a phosphorous halide, a silicon halide, a boron hydride, a sulphur hydride, a phosphorous hydride or a silicon hydride, wherein the substrate is exposed to said mixture for a predetermined time to provide substantially complete nucleation of said substrate with a uniform layer of tantalum or niobium containing material via an irreversible reaction; and depositing tantalum or niobium on said nucleated substrate by then exposing at a predetermined temperature said nucleated substrate to a gaseous mixture of tantalum or niobium halide and hydrogen without the presence of a nucleating agent for a predetermined period of time sufficient to deposit by a reversible reaction a layer of tantalum or niobium not exceeding an average of 0.3 microns in thickness.

2. A process as claimed in claim 1, and wherein both of said predetermined temperatures are within the range 900° C. to 1100° C.

3. A process as claimed in claim 1, wherein gaseous tantalum halide is used in said nucleating step, the deposited metal of said depositing step comprises tantalum and the substrate comprises alumina.

4. A process as claimed in claim 3, wherein said nucleating agent is ammonia.

5. A process as claimed in claim 1, wherein the substrate particles are of 1 to 30 microns in diameter.

6. A process as claimed in claim 4 for depositing a substantially uniform tantalum coating on an alumina powder, wherein said tantalum halide comprises tantalum chloride and said gaseous mixture is provided by dispersing a mixture of alumina and tantalum powders on a fluidised bed in a hydrogen atmosphere at a temperature of 900°–1100° C., and exposing the powders to a mixture of hydrogen, hydrogen chloride and ammonia so as to nucleate the surface of each alumina particle and transport tantalum metal thereto.

* * * * *